(12) United States Patent
Venkatraman

(10) Patent No.: US 7,851,852 B2
(45) Date of Patent: Dec. 14, 2010

(54) METHOD OF FORMING A LOW CAPACITANCE SEMICONDUCTOR DEVICE AND STRUCTURE THEREFOR

(75) Inventor: Prasad Venkatraman, Gilbert, AZ (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 0 days.

(21) Appl. No.: 12/574,934

(22) Filed: Oct. 7, 2009

(65) Prior Publication Data

US 2010/0025745 A1 Feb. 4, 2010

Related U.S. Application Data

(60) Continuation of application No. 11/671,664, filed on Feb. 6, 2007, now Pat. No. 7,619,287, which is a division of application No. 10/942,060, filed on Sep. 16, 2004, now Pat. No. 7,192,814.

(51) Int. Cl.
*H01L 29/66* (2006.01)

(52) U.S. Cl. .................. 257/327; 257/315; 257/341; 257/390; 257/401; 257/620; 257/E29.027; 257/E29.121; 257/E29.257

(58) Field of Classification Search ............... 257/315, 257/327, 341, 390, 401, 620, E29.027, E29.121, 257/E29.257
See application file for complete search history.

(56) References Cited

U.S. PATENT DOCUMENTS

| 5,631,484 | A | 5/1997 | Tsoi et al. |
| 5,998,833 | A | 12/1999 | Baliga |
| 6,107,160 | A | 8/2000 | Hebert et al. |
| 6,197,640 | B1 | 3/2001 | Davies |
| 6,222,229 | B1 | 4/2001 | Hebert et al. |
| 6,388,286 | B1 | 5/2002 | Baliga |
| 6,525,372 | B2 | 2/2003 | Baliga |
| 6,621,121 | B2 | 9/2003 | Baliga |
| 6,649,975 | B2 | 11/2003 | Baliga |
| 6,683,346 | B2 | 1/2004 | Zeng |
| 2002/0140042 | A1 | 10/2002 | Stout |
| 2004/0108547 | A1 | 6/2004 | Venkatraman |

FOREIGN PATENT DOCUMENTS

| EP | 0112607 B1 | 3/1987 |
| EP | 0067475 B1 | 11/1987 |
| JP | 59084474 A | 5/1984 |
| JP | 01-111378 A | 4/1989 |

*Primary Examiner*—Long K Tran
(74) *Attorney, Agent, or Firm*—Robert F. Hightower

(57) ABSTRACT

In one embodiment a transistor is formed with a gate structure having an opening in the gate structure. An insulator is formed on at least sidewalls of the opening and a conductor is formed on the insulator.

4 Claims, 6 Drawing Sheets

METHOD OF FORMING A LOW CAPACITANCE SEMICONDUCTOR DEVICE AND STRUCTURE THEREFOR

The present application is a continuation of U.S. application Ser. No. 11/671,664 filed on 6 Feb. 2007 now U.S. Pat. No. 7,619,287, which was a divisional of U.S. application Ser. No. 10/942,060, filed on 16 Sep. 2004, now U.S. Pat. No. 7,192,814 all of which are hereby incorporated by reference, and priority thereto for common subject matter is hereby claimed. Additionally, this application is related to commonly assigned application Ser. No. 10/741,330 entitled "Semiconductor Device Having Reduced Gate Charge And Reduced On Resistance And Method" filed on Dec. 22, 2003, now U.S. Pat. No. 7,189,608.

BACKGROUND OF THE INVENTION

The present invention relates, in general, to electronics, and more particularly, to methods of forming semiconductor devices and structure.

In the past, the electronics industry utilized various methods and structures to produce power devices that had a low drain to source resistance (Rds(on)). The low Rds(on) reduced the power loss in the power device when the device was on, thus increasing the system efficiency. Typically the devices had high gate capacitances that resulted in a high total gate charge (Qg) and reduced the maximum operating frequency of the devices.

In some applications such as switching power supplies, good switching performance was also required for the power MOSFET, in addition to the low Rds(on). One requirement for such a power MOSFET was a low gate charge (Qg). The gate charge Qg was defined as the charge that had to be supplied to the gate by the driver IC, in order to charge the gate to its operating voltage. For power MOSFETs that were used in the low side of a switching power supply (for example, a buck converter), an additional requirement was good dV/dt performance (i.e. the capability to withstand a high rate of change of drain voltage, without experiencing a false turn-on). In a buck converter, when the high side MOSFET turned on, the switch node (to which the drain of the low side MOSFET was connected), experienced a high dV/dt. This high rate of change of drain voltage in the low side MOSFET caused a spike in the gate voltage. If the magnitude of the gate voltage spike was higher than the threshold voltage (Vth) of the low side MOSFET, then the low side MOSFET turned on. This was called false turn-on and it caused shoot-through current that lowered the efficiency of the system by causing additional power loss. In severe cases, the shoot-through current also caused one of the MOSFETs to fail.

Accordingly, it is desirable to have a method of forming a power device that reduces gate capacitances, that reduces the gate charge ratio Qgd/Qgs(th), and that reduces the total gate charge of the power device while not affecting the Rds(on) of the device significantly.

BRIEF DESCRIPTION OF THE DRAWINGS

FIG. 7 schematically illustrates a portion of an alternate embodiment of the semiconductor device of FIGS. 1-6 in accordance with the present invention; and.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
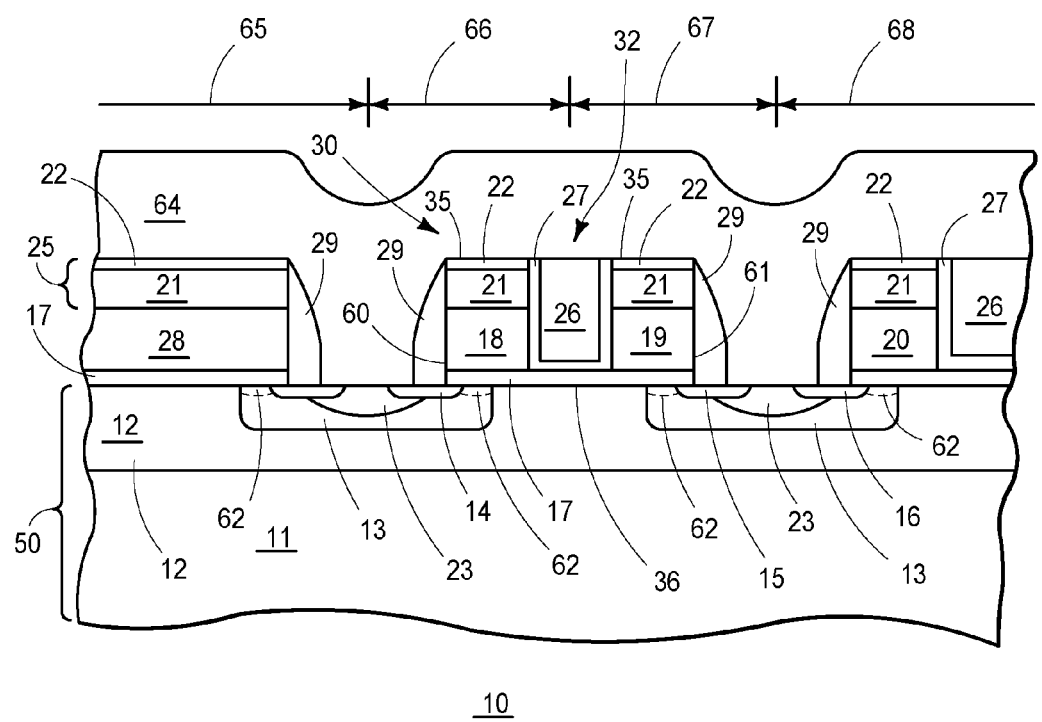
FIG. 1 schematically illustrates an enlarged cross-sectional portion of an embodiment of a semiconductor device in accordance with the present invention.

FIG. 1 schematically illustrates an enlarged cross-sectional portion of a semiconductor device 10 that has a low gate-to-drain capacitance (Cgd) and that has a low ratio between the gate-to-drain and gate-to-source capacitance (Qgd/Qgs(th)) which facilitates high frequency operation and minimizes shoot-through currents.

Figure 2:
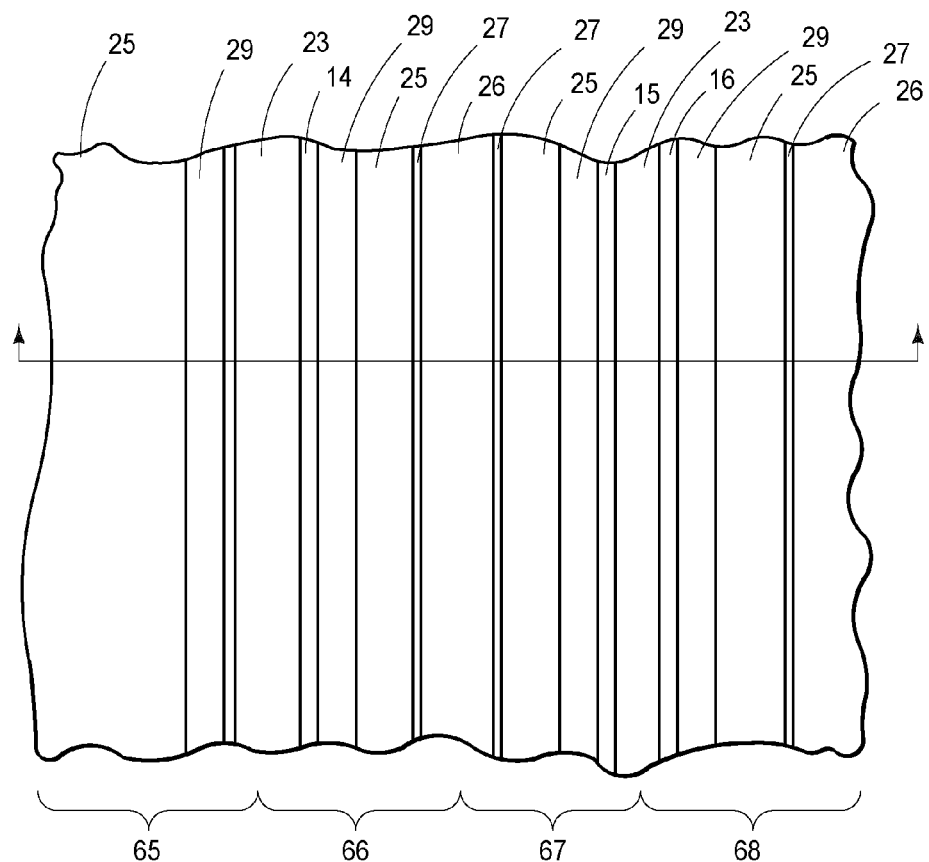
FIG. 2 schematically illustrates an enlarged plan view of a portion of a topology of an embodiment of the semiconductor device of FIG. 1 in accordance with the present invention.

FIG. 2 schematically illustrates an enlarged plan view of a portion of a topology of an embodiment of device 10. The plan view of FIG. 2 excludes a source conductor 64 in order to illustrate the underlying elements of device 10. The view of FIG. 1 is taken along a section line 1-1 of FIG. 2. The following description has references to both FIG. 1 and FIG. 2. The embodiments of device 10 illustrated in FIG. 1 and FIG. 2 include a plurality of vertical metal oxide semiconductor (MOS) transistor structures including a first transistor stripe or transistor 65, a second transistor stripe or transistor 66, a third transistor stripe or transistor 67, and a fourth transistor stripe or transistor 68 that are formed in a stripe configuration, for example a configuration having body regions formed as a plurality of elongated regions with each body region having a plurality of transistor sources. Transistors 65, 66, 67, and 68 are identified in a general manner by arrows. Device 10 has an N-type semiconductor substrate 50 that includes an N-type bulk semiconductor substrate 11 on which a N-type epitaxial layer 12 is formed. N-type sources 14, 15, and 16 are formed within P-type body regions 13. Heavily doped P-type regions 23 within body regions 13 facilitate forming low resistance electrical contact to body regions 13. A gate structure 30 for transistors 66 and 67 is formed overlying a surface 36 of substrate 50 with at least a first edge 60 of structure 30 overlying at least an edge of source 14 and at least a second edge 61 of structure 30 overlying at least an edge of source 15. Edges 60 and 61 generally overlie respective sources 14 and 15 about one-tenth to one-half (0.1 to 0.5) microns. As will be seen further hereinafter, gate structure 30 has a conductor plug that includes an insulator 27 that is formed on at least sidewalls of an opening 32 that is formed within gate structure 30, and a conductor 26 that is formed on insulator 27. Conductor 26 is electrically connected to a source conductor 64. As will be seen further hereinafter, opening 32 is formed in gate structure 30 so that opening 32 overlies a portion of substrate 50 that is positioned in-between source 14 and source region 15 and preferably is positioned in-between regions 13 in which sources 14 and 15 are formed. Gate structure 30 and opening 32 are identified in a general manner by arrows. Other transistors of device 10, such as transistors 65 and 68, have gate structures similar to structure 30 as illustrated in FIG. 1. When device 10 is turned on, a portion of regions 13 that is underlying gate structure 30 and similar adjacent gate structures forms channel regions 62 of transistors 65, 66, 67, and 68. Also a portion of substrate 50 underlying gate structure 30 and similar adjacent gate structures forms a drain region of transistors 65, 66, 67, and 68.

In order to reduce the likelihood of false turn-on and related shoot-through current, it is desirable to minimize the voltage spike that is coupled to the gate of a transistor when the drain electrode is pulled high. One way to achieve this is to reduce the coupling between the drain and gate by reducing the gate to drain capacitance (Cgd), which also reduces the gate to drain charge (Qgd). In order to prevent the gate voltage spike from being greater than the threshold voltage (Vth), the ratio of the gate-to-drain charge (Qgd) to the gate-to-source charge that is required induce a voltage equal to Vth (Qgs(th)) should be less than 1 (Qgd/Qgs(th)<1). It is also desirable to have a low total gate charge in order to improve the operating frequency. Reducing the gate-to-drain capacitance reduces the gate-to-drain charge (Qgd) and reducing the gate-to-source capacitance reduces the gate-to-source charge (Qgs). As will be seen further hereinafter, forming conductor 26 within opening 32 assists in reducing the gate-to-drain capacitance (Cgd) of device 10. Minimizing the amount of gates 18 and 19 that overlie the drain of device 10 also assists in reducing the gate-to-drain capacitance, thus, the gate-to-drain charge (Qgd) of device 10.

It has been found that forming conductor 26 within opening 32 assists in further reducing the gate-to-drain capacitance, by causing a portion of the charge in the drain region to be coupled to the source, instead of to the gate. Conductor 26 is formed within opening 32, and is removed from a top surface 35 of structure 30. Reducing the gate-to-drain charge also reduces the gate charge ratio (Qgd/Qgs(th)) thereby minimizing the false turn-on of device 10. It is believed that device 10 has a gate charge ratio (Qgd/Qgs(th)) that is below one (1) which is much less than the gate charge ratio of two to four of prior art power devices. Reducing the gate-drain charge also reduces the total gate charge thereby increasing the operating frequency of device 10.

FIG. 3-FIG. 6 schematically illustrate various stages according to an embodiment of a method of forming device 10. This description has references to FIGS. 1-6. For clarity of the explanation, the description of FIGS. 3-6 illustrates the portion of device 10 illustrated in FIG. 1. Although device 10 is illustrated with specific conductivity types for an N-channel device, the conductivity types may be reversed to provide a P-channel device. In addition, device 10 is illustrated to show either a stripe design (where the body regions are a plurality of elongated regions) or a single body region design that typically is formed in an elongated pattern or a serpentine pattern. Thus, it will be understood by those skilled in the art that the present invention encompasses either a stripe design, a closed cell design, a multiple cell design, or a single body design.

Figure 3:
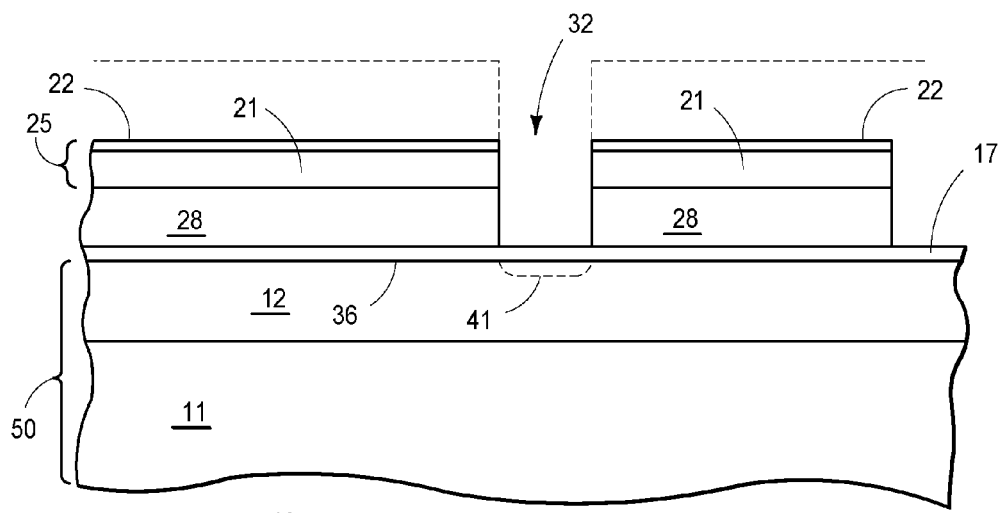
FIG. 3 through FIG. 6 schematically illustrate various stages according to an embodiment of a method of forming the semiconductor device of FIG. 1 and FIG. 2 in accordance with the present invention.

Referring to FIG. 3, device 10 is formed on a bulk N-type semiconductor substrate 11 which has an N-type epitaxial layer 12 formed on a surface thereof. Substrate 11 and layer 12 comprise semiconductor substrate 50. A gate insulator layer 17 is formed on a portion of surface 36 of substrate 50 where transistors 65-68 are being formed. Typically, the resistivity of substrate 11 is about 0.001 to 0.01 ohm-cm and the resistivity of layer 12 is approximately 0.1 to 10 ohm-cm. In the preferred embodiment, gate insulator layer 17 is a layer of silicon dioxide having a thickness of approximately one hundred (100) to eight hundred (800) angstroms.

A gate conductor layer 28 is formed on layer 17 overlying at least a portion of substrate 50 where transistors 65-68 are being formed. Gate conductor layer 28 typically is a conductor material such as a refractory metal, a refractory metal silicide, a refractory metal salicide, or doped poly-crystalline silicon (doped polysilicon). In one embodiment, layer 28 is N-type polysilicon having a sheet resistance of at least approximately one hundred (100) ohm/sq and preferably about ten to thirty (10 to 30) ohm/sq. Subsequently, a protective insulating layer 25 is formed on gate conductor layer 28 to insulate layer 28 from other conductors that will subsequently be formed. In one embodiment, insulating layer 25 is a silicon dioxide layer, deposited to a thickness of about three thousand to ten thousand (3000-10,000) angstroms. In another embodiment, insulating layer 25 includes a silicon dioxide layer 21 that is formed on layer 28 and a silicon nitride layer 22 that is formed on layer 21. In another embodiment, layer 25 may also include another silicon dioxide layer that is formed on layer 22. The thickness of layer 25 keeps source conductor 64 (See FIG. 1) sufficiently far from gates 18 and 19 to reduce the gate-to-source capacitance of device 10. Layer 21 typically has a thickness of about three thousand to ten thousand (3000-10000) angstroms and layer 22 has a thickness of about two hundred to fifteen hundred (200-1500) angstroms. Other insulators may also be used for layer 25.

Typically, a mask (illustrated by dashed lines) is applied on the surface of layer 25 and patterned to expose the desired portions of layer 25 where opening 32 is to be formed. Opening 32 is formed through the openings in the mask to extend from the surface of layer 25, through layer 28 to expose a portion of layer 17. In some embodiments, opening 32 may extend into or through layer 17. The width of opening 32 can be as wide as possible as long as opening 32 does not overlie regions 13. In some embodiments, an optional doped region 41 may also be formed as a doped region on the surface of substrate 50 and extending into substrate 50 underlying opening 32. Region 41 may be doped P-type to form a capacitance shield area to further reduce the gate-to-drain capacitance of device 10, or it may be doped N-type to further reduce the Rds(on) of device 10. Optional doped region 41 is illustrated by a dashed line.

Figure 4:
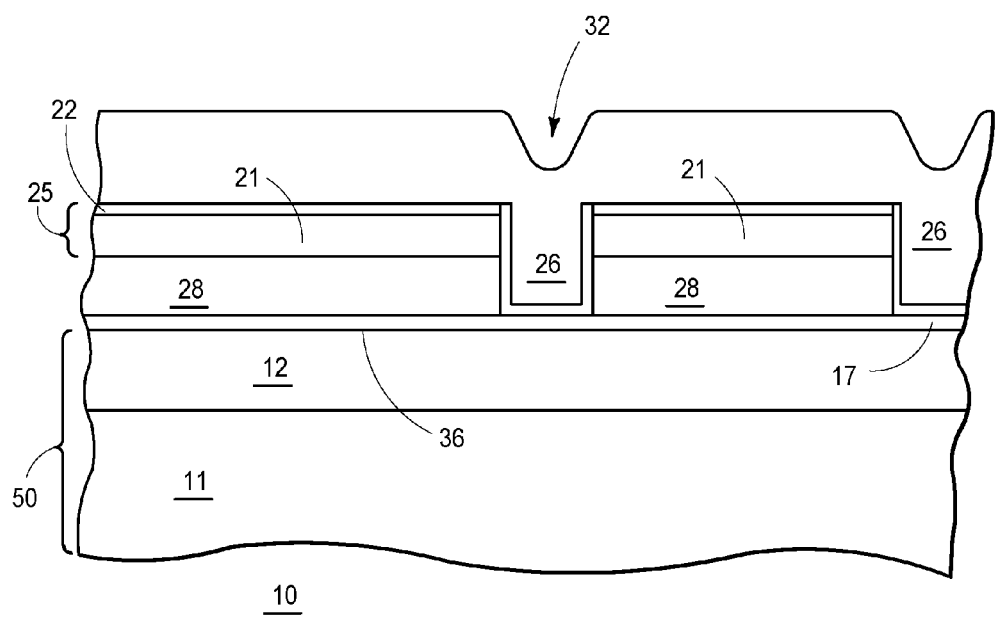

Referring to FIG. 4, an insulator 27 is formed on the sidewalls of opening 32 thus on the sidewalls of gate structure 30. Insulator 27 insulates gates 18 and 19 (see FIG. 1) from conductor 26. Insulator 27 forms a dielectric of a capacitor that causes a portion of the charge in the drain region to be coupled to the source, instead of the gate. Thus it is desirable to have a high dielectric constant for the material of layer 27. In one embodiment, insulator 27 is a layer of silicon dioxide that is deposited along the sidewalls of gate structure 30, onto the portion of gate insulator layer 17 that is exposed within opening 32, and not on surface 35. The silicon dioxide layer generally has a thickness of about one hundred to one thousand (100-1000) angstroms. In another embodiment, layer 27 includes a silicon dioxide layer that is formed on the sidewalls of gate structure 30 and on top of gate insulator 17, and a silicon nitride layer that is formed on the silicon dioxide layer. Using both the silicon dioxide layer and the silicon nitride layer facilitates increasing the dielectric constant of layer 27. This allows the use of a thicker insulating layer 27, which reduces the incidence of shorts between gate structure 30, and subsequently deposited conductor 26. The silicon dioxide layer typically has a thickness of about one hundred to five hundred (100-500) angstroms and the silicon nitride layer typically has a thickness of about two hundred to fifteen hundred (200-1500) angstroms. In some embodiments, insulator 27 may also be formed on surface 35.

Subsequently, conductor 26 is formed to fill the remainder of opening 32. The material used for conductor 26 can be any of a variety of conductor materials including a refractory metal, a refractory metal silicide, a refractory metal salicide, or doped poly-crystalline silicon (doped polysilicon). In the preferred embodiment, conductor 26 is N-type polysilicon having a doping concentration of at least 1E18 ohm-cm in order to provide a sheet resistance of at least approximately two thousand (2000) ohm/sq and preferably about ten to one hundred (10 to 100) ohm/sq. In the preferred embodiment, conductor 26 is formed with a thickness sufficient to at least fill opening 32 so that a portion of conductor 26 is substantially coplanar to surface 35. Typically, conductor 26 is applied to a thickness sufficient to fill all of opening 32 but not to extend past surface 35.

Figure 5:
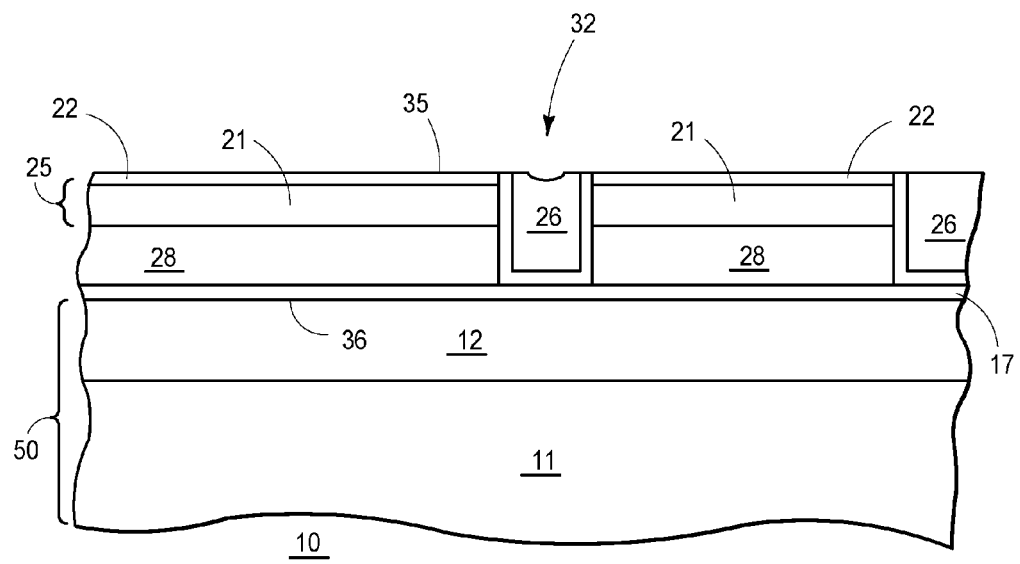

Referring to FIG. 5, a planarization process usually is utilized to remove all the material of conductor 26 that extends past surface 35. For example, a chemical-mechanical planarization process (CMP) or an RIE etch-back, or other well-known planarization process may be used. The goal is to remove substantially all of conductor 26 that extends past surface 35 such that conductor 26 is substantially coplanar with surface 35. Due to processing variations a portion of conductor 26 may be slightly recessed below surface 35.

Figure 6:
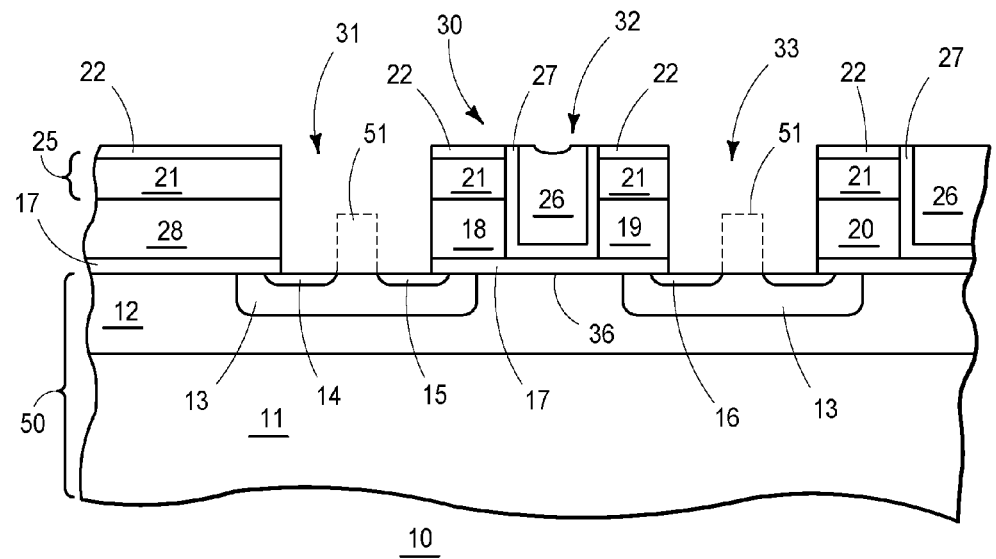

Referring to FIG. 6, openings 31 and 33 are formed in layer 25 and layer 28. Typically, a mask (not shown) is applied onto the surface of layer 25 and patterned to expose the desired portions of layer 25 where openings 31 and 33 are to be formed. Openings 31 and 33 are formed through the openings in the mask to extend from the surface of layer 25 through layer 28 to expose layer 17. Openings 31 and 33 are used to dope the first and second portion of substrate 50 to form body regions 13 extending from first surface 36 of substrate 50 a first distance into substrate 50. Regions 13 typically are formed by ion implantation and activation techniques that are well known to those skilled in the art. Openings 31 and 33 form portions of layers 28 and 25 into gate structure 30 that forms the gate of transistors 66 and 67. Opening 32 forms gate structure 30 into a first gate section that includes first gate 18 that is a first portion of gate conductor layer 28 and the overlying portions of layer 25, and into a second gate section that includes second gate 19 of gate conductor layer 28 and the overlying portions of layer 25. The first gate section functions as the gate of transistor 66, and the second gate section functions as the gate of transistor 67. Opening 32 and the conductor plug minimize the amount of gate structure 30 overlying the drain portion of transistors 47 and 48 thereby minimizing the gate-to-drain capacitance (Cgd) of device 10. It has been found that conductor 26 within opening 32 also reduces Cgd. As a result, the gate-to-drain charge (Qgd) of device 10 is about forty percent (40%) less that in the prior art. Opening 32, top surface 35 of structure 30, and the conductor plug typically extend in a general manner laterally across substrate 50 and laterally overlying surface 36 according to the layout pattern selected for gate structure 30. See FIG. 2 for one example of a layout topology for device 10 with the conductor plug and opening 32 extending laterally across substrate 50. Also, surface 35 typically is substantially parallel to surface 36. However, those skilled in the art realize that surface 35 generally is not exactly parallel to surface 36 but may have an irregular surface due to processing of underlying elements of device 10.

Thereafter, N-type sources 14, 15, and 16 are formed within body regions 13. Typically a mask layer, such as photo-resist, is applied to device 10 and patterned to leave blocking portions 51 within openings 31 and 33. The mask layer is not shown in FIG. 3 for clarity of the drawings. For the case where transistor 65 is an end transistor of a plurality of transistor cells, portion 51 within opening 31 may extend across surface 36 to the side of layer 28 to prevent forming a source region in the underlying portion of region 13. Sources 14, 15, and 16 are formed by doping the surface of substrate 50 through openings 31 and 33 and around blocking portions 51 by techniques that are well known to those skilled in the art.

Referring again to FIG. 1, spacers 29 are formed within openings 31 and 33 along the sidewalls of openings 31 and 33 and extending a first distance across the underlying portion of surface 36. Spacers 29 are formed by techniques that are well known to those skilled in the art. For example, spacers 29 may be formed by applying a spacer dielectric layer, not shown, such as TEOS covering device 10 and including openings 31 and 33. An anisotropic etch can be used to remove portions of the spacer dielectric layer from surface 36 of substrate 50, and surface 35 of gate structure 30 and the top surface of conductor plug 26, and leave portions of the spacer dielectric layer as spacers 29. The portion of substrate 50 exposed within openings 31 and 33 is doped to form heavily doped P-regions 23. Spacers 29 are used to protect portions of sources 14-16 while forming regions 23 within regions 13 and abutting respective sources 14, 15, and 16. A source conductor 64 is applied within openings 31 and 33 and across onto gate structure 30. Conductor 64 forms electrical contact to sources 14-16, heavily doped P-regions 23, and conductor 26.

Figure 7:
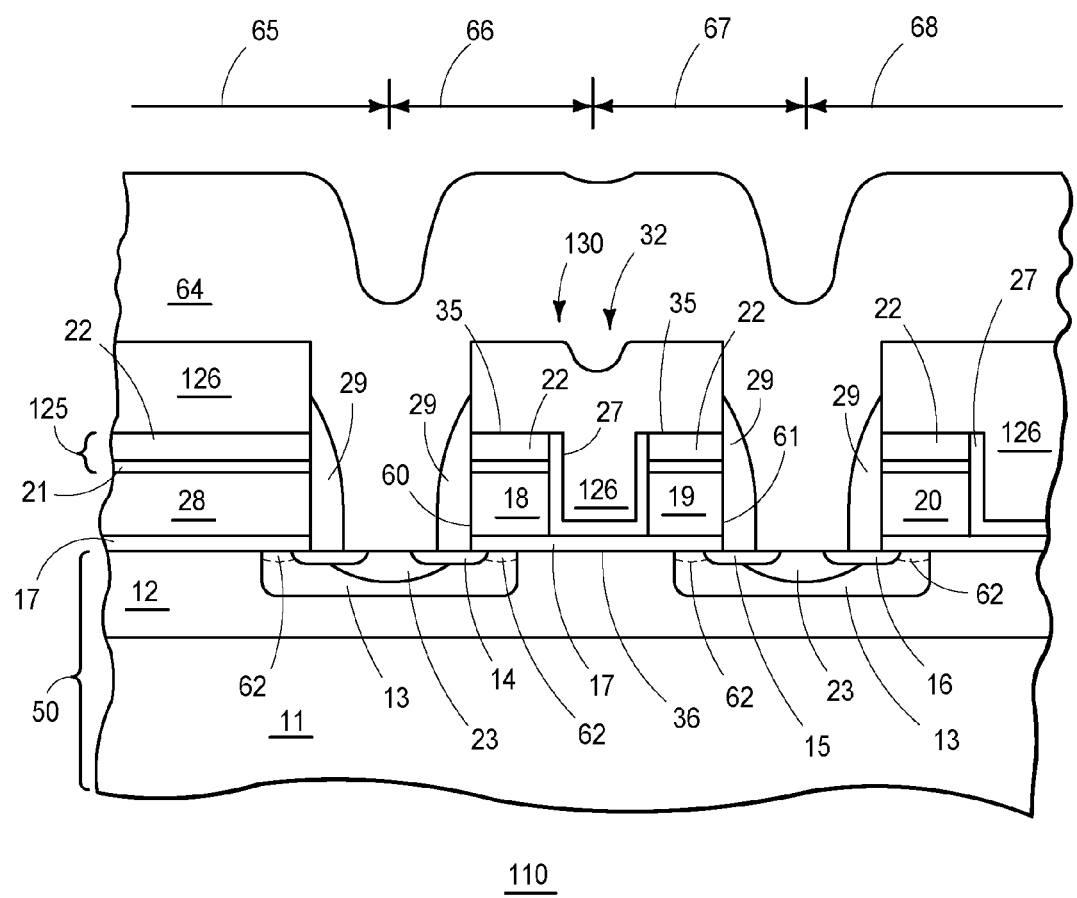

FIG. 7 schematically illustrates a portion of an embodiment of semiconductor device 110 that is an alternate embodiment of device 10 explained in the description of FIGS. 1-6. Device 110 is similar to device 10, except that conductor 26 of device 10 is extended onto surface 35 to form conductor 126 thereby forming a gate structure 130 that is similar to structure 30 except for replacing conductor 26 with conductor 126. Also, layer 25 is replaced with a layer 125. Layer 125 is the same materials as layer 25 but is thinner. Using both silicon dioxide layer 21 and silicon nitride layer 22 to insulate layer 28 facilitates increasing the dielectric constant of the gate-to-source capacitor that includes portions of layer 22. Conductor 126 increases the gate-to-source capacitance of device 110 thereby decreasing the gate charge ratio (Qgd/Qgs(th)) of device 110. Conductor 126 is formed similarly to conductor 26 except that conductor 126 is formed on surface 35 and is not removed from surface 35 in order to form conductor 126.

Alternatively, opening 32 may be formed in layer 28 prior to forming layer 125. Layer 125 may be formed on layer 28, along the sidewalls of opening 32, and on the exposed portions of layer 17 within opening 32. Since layer 125 in device 110 is thinner than layer 25 in device 10, the gate to source capacitance of device 110 is increased further, resulting in a lower Qgd/Qgs(th) ratio.

Figure 8:
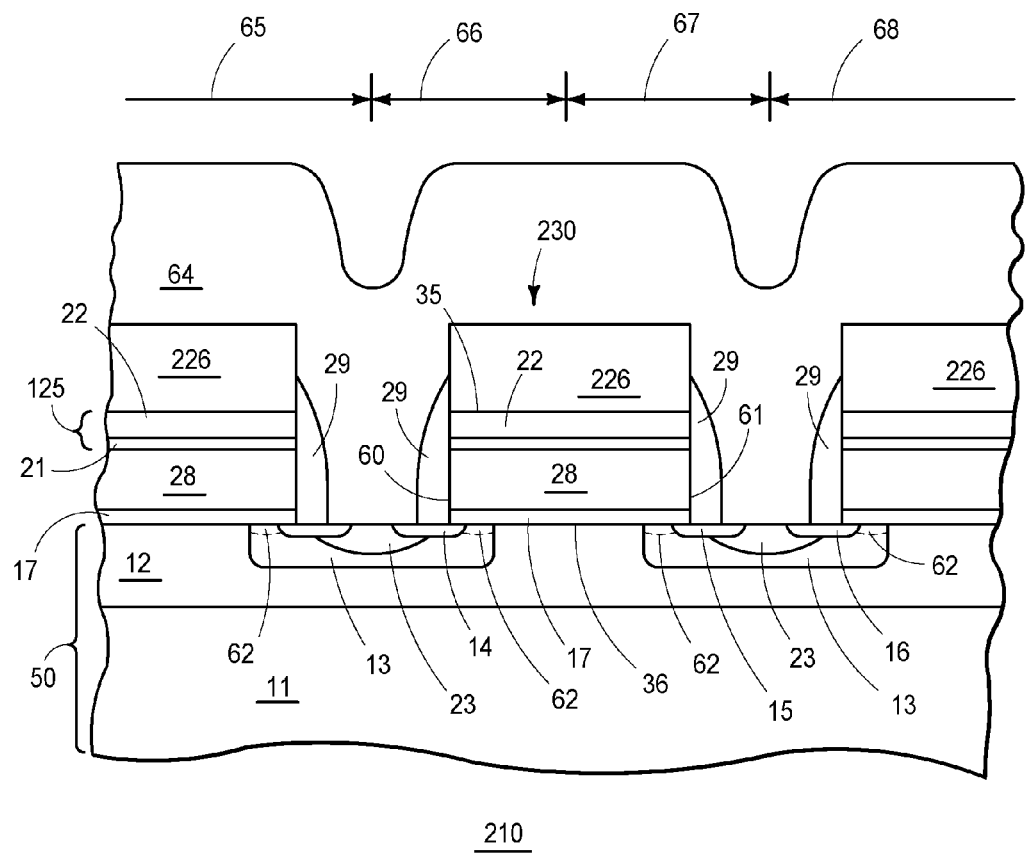
FIG. 8 schematically illustrates a portion of another alternate embodiment of the semiconductor device of FIGS. 1-6 in accordance with the present invention.

FIG. 8 schematically illustrates a portion of an embodiment of semiconductor device 210 that is an alternate embodiment of device 10 explained in the description of FIGS. 1-6. Device 210 includes a gate structure 230. Gate structure 230 is similar to structure 30 except that opening 32 is not formed in structure 230. Insulator layer 25 is formed on gate layer 28. Consequently, device 210 does not have insulator 27, and conductor 26 is not formed within opening 32. Instead, a conductor 226 is formed on surface 35 of layer 25. The material of conductor 226 is the same as the material of conductor 26. The thickness of conductor 226 is selected to be about two thousand to ten thousand (2000-10,000) angstroms. Conductor 226 increases the gate-to-source capacitance of device 210 thereby decreasing the gate charge ratio. Conductor 226 also increases the height of gate structure 230, thus facilitating the formation of spacers 29. Device 210 is formed similarly to device 10, except that opening 32 and insulator 27 are omitted, and conductor 26 is formed on surface 35 to form conductor 226. In some applications it is important to reduce the shoot-through currents even if the gate-to-source capacitance may be increased.

In view of all of the above, it is evident that a novel device and method is disclosed. Included, among other features, is forming semiconductor device having a conductor plug extending into or through the gate structure. The conductor plug reduces the gate-to-drain capacitance facilitating higher operating frequencies and reduces the gate charge ratio thereby reducing shoot-through currents. In other embodiments, forming a conductor on the gate structure with an underlying thin insulator increases the gate-to-source capacitance which reduces the gate charge ratio and reduces shoot-through currents.

While the invention is described with specific preferred embodiments, it is evident that many alternatives and variations will be apparent to those skilled in the semiconductor arts. More specifically examples of manufacturing process for forming devices 10, 110, and 210 are described, however, other manufacturing operations may be used. For example, the manufacturing process described involves using a mask to form opening 32, and a second mask to form openings 31 and 33. In an alternate manufacturing process, openings 32, 31, and 33 may all be formed simultaneously using a single mask, thus eliminating any misalignment due to the lithography step. The invention is described for a particular N-channel MOS transistor, however, the invention is applicable to P-channel MOS transistors, BiCMOS, IGBT's, and other device structures.

The invention claimed is:

1. A semiconductor device comprising:
   a substrate of a first conductivity type having a first surface;
   a first source region of the first conductivity type on the first surface of the substrate;
   a second source region of the first conductivity type on the first surface of the substrate wherein the second source region is spaced apart from the first source region;
   a gate structure overlying the first surface of the substrate, the gate structure having a first end overlying an edge of the first source region, a second end overlying an edge of the second source region, the gate structure having a first surface substantially parallel to the first surface of the substrate and facing away from the first surface of the substrate;
   a gate conductor of the gate structure overlying the substrate;
   an insulator layer of the gate structure on the gate conductor;
   a first conductor on the insulator layer; and
   a source conductor formed on the first conductor subsequently to forming the first conductor.

2. The semiconductor device of claim 1 wherein the insulator layer is no thicker than about 10,000 Angstroms.

3. The semiconductor device of claim 1 wherein the first conductor includes doped polysilicon.

4. The semiconductor device of claim 1 wherein the first surface of the gate structure is devoid of an opening extending into the gate structure.

* * * * *